(12) United States Patent
Terai et al.

(10) Patent No.: US 9,153,512 B2
(45) Date of Patent: Oct. 6, 2015

(54) SEMICONDUCTOR DEVICE WITH AN INSULATING TERMINAL TABLE

(75) Inventors: Mamoru Terai, Tokyo (JP); Seiki Hiramatsu, Tokyo (JP); Tatsuo Ota, Tokyo (JP); Hiroya Ikuta, Tokyo (JP); Takashi Nishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/980,692

(22) PCT Filed: Apr. 22, 2011

(86) PCT No.: PCT/JP2011/059945
§ 371 (c)(1),
(2), (4) Date: Jul. 19, 2013

(87) PCT Pub. No.: WO2012/144070
PCT Pub. Date: Oct. 26, 2012

(65) Prior Publication Data
US 2013/0306991 A1 Nov. 21, 2013

(51) Int. Cl.
*H01L 23/28* (2006.01)
*H01L 29/16* (2006.01)
(Continued)

(52) U.S. Cl.
CPC .............. *H01L 23/28* (2013.01); *H01L 25/07* (2013.01); *H01L 25/18* (2013.01); *H01L 29/16* (2013.01);
(Continued)

(58) Field of Classification Search
CPC .............................. H01L 23/28; H01L 29/16
USPC ................ 257/77, 76, 737, 772, 777, 711; 438/460, 122, 685
See application file for complete search history.

(56) References Cited

U.S. PATENT DOCUMENTS 4,905,111 A * 2/1990 Tuma et al. .............. 360/125.01
5,309,016 A * 5/1994 Kasai et al. .................... 257/666
(Continued)

FOREIGN PATENT DOCUMENTS

JP 58 017646 2/1983
JP H06-163746 6/1994
(Continued)

OTHER PUBLICATIONS

International Search Report Issued May 24, 2011 in PCT/JP11/59945 Filed Apr. 22, 2011.
(Continued)

*Primary Examiner* — Sheng Zhu
(74) *Attorney, Agent, or Firm* — Oblon, McClelland, Maier & Neustadt, L.L.P.

(57) ABSTRACT

A semiconductor device includes: a semiconductor-element substrate in which a front-surface electrode pattern is formed on a surface of an insulating substrate and a back-surface electrode is formed on another surface; semiconductor elements affixed to the surface of the front-surface electrode pattern opposite the insulating substrate; and a sealing resin member which covers the semiconductor element and the semiconductor-element substrate, wherein at a position of the front-surface electrode pattern where the position has potential equivalent to that of the front-surface electrode pattern at a position where a semiconductor element is bonded, an insulating terminal table formed with a conductive relay terminal and an insulating member that insulates the relay terminal and the front-surface electrode pattern from each other are provided, and wiring from the semiconductor element to the outside is led out via the relay terminal.

11 Claims, 9 Drawing Sheets

(51) Int. Cl.
*H01L 25/07* (2006.01)
*H01L 25/18* (2006.01)

(52) U.S. Cl.
CPC ............... *H01L 2224/32225* (2013.01); *H01L 2224/45015* (2013.01); *H01L 2224/48091* (2013.01); *H01L 2224/48137* (2013.01); *H01L 2224/48227* (2013.01); *H01L 2224/4903* (2013.01); *H01L 2224/73265* (2013.01); *H01L 2924/13091* (2013.01); *H01L 2924/19107* (2013.01)

(56) References Cited

U.S. PATENT DOCUMENTS

| | | | |
|---|---|---|---|
| 6,265,784 B1* | 7/2001 | Kawano et al. | 257/788 |
| 2004/0102023 A1* | 5/2004 | Morozumi et al. | 438/460 |
| 2005/0219148 A1* | 10/2005 | Bayley et al. | 345/1.3 |
| 2006/0040526 A1* | 2/2006 | Shirota | 439/76.2 |
| 2007/0262387 A1* | 11/2007 | Nonaka et al. | 257/356 |
| 2007/0290342 A1* | 12/2007 | Ishikawa | 257/737 |

FOREIGN PATENT DOCUMENTS

| | | |
|---|---|---|
| JP | 6-252284 A | 9/1994 |
| JP | H10-050897 | 2/1998 |
| JP | 2003 124401 | 4/2003 |
| JP | 2006-303481 A | 11/2006 |
| JP | 2009-289920 A | 12/2009 |
| JP | 2009-302552 | 12/2009 |

OTHER PUBLICATIONS

Office Action issued Aug. 5, 2014 in Japanese Patent Application No. 2013-510810 (with partial English language translation).
Office Action issued Mar. 31, 2015 to Japanese Patent Application No. 2013-510810, with English translation.

* cited by examiner

|  | Example of this invention | Comparative Example |
| --- | --- | --- |
| Initial stage | > 6kV | > 6kV |
| After 100 cycles | > 6kV | 4.2kV |
| After 200 cycles | > 6kV | 2.3kV |
| After 300 cycles | > 6kV | 2.2kV |
| After 600 cycles | > 6kV | 2.3kV |

|  | Example 2-1 | Example 2-2 | Example 2-3 | Example 2-4 | Example 2-5 | Example 2-6 |
|---|---|---|---|---|---|---|
| Modulus of elasticity of partition wall | 15KPa | 30kPa | 3.5MPa | 900MPa | 1400MPa | 3000MPa |
| Life on power cycle test (Cycles) | 110000 | 200000 | 210000 | 210000 | 180000 | 120000 |
| Life on heat cycle test (Cycles) | 200 | 800 | >1200 | >1200 | 500 | 250 |

FIG. 13

|  | Example 3-1 | Example 3-2 | Example 3-3 | Example 3-4 | Example 3-5 | Example 3-6 | Example 3-7 |
|---|---|---|---|---|---|---|---|
| Modulus of elasticity of first sealing resin member | 0.9GPa | 1GPa | 7GPa | 12GPa | 14GPa | 20GPa | 22GPa |
| Life on power cycle test (Cycles) | 100000 | 170000 | 210000 | 170000 | 140000 | 110000 | 100000 |
| Life on heat cycle test (Cycles) | 100 | 350 | >1200 | 700 | 500 | 450 | 200 |

FIG. 14

|  | Example 4-1 | Example 4-2 | Example 4-3 | Example 4-4 | Example 4-5 | Example 4-6 | Example 4-7 |
|---|---|---|---|---|---|---|---|
| Modulus of elasticity of first sealing resin member | 0.9GPa | 1GPa | 7GPa | 12GMPa | 14GPa | 20GPa | 22GPa |
| Life on power cycle test (Cycles) | 100000 | 170000 | 210000 | 170000 | 140000 | 110000 | 100000 |
| Life on heat cycle test (Cycles) | 150 | 400 | >1200 | 500 | 450 | 370 | 150 |

FIG. 15

|  | Example 5-1 | Example 5-2 | Example 5-3 | Example 5-4 | Example 5-5 | Example 5-6 | Example 5-7 |
|---|---|---|---|---|---|---|---|
| Modulus of elasticity of first sealing resin member | 0.9GPa | 1GPa | 7GPa | 12GPa | 14GPa | 20GPa | 22GPa |
| Life on power cycle test (Cycles) | 100000 | 170000 | 210000 | 170000 | 140000 | 110000 | 100000 |
| Life on heat cycle test (Cycles) | 50 | 300 | 1100 | 600 | 500 | 400 | 200 |

FIG. 16

SEMICONDUCTOR DEVICE WITH AN INSULATING TERMINAL TABLE

TECHNICAL FIELD

This invention relates to a semiconductor device, especially to the mounting configuration of the semiconductor device which operates at high temperatures.

BACKGROUND ART

With the development of industrial equipment, electric railroads and automobiles, operation temperatures of semiconductor elements which are used for them have been increased. Recently, development for semiconductor elements which operate even at high temperatures has been carried out energetically, and reduction in the size, increase in the withstand voltage and increase in the current density of the semiconductor elements has been progressed. Particularly, wide band gap semiconductors such as SiC, GaN, etc. have a larger band gap than that of Si semiconductors. Therefore, increase in the withstand voltage, reduction in the size, increase in the current density, and operation at high temperatures of semiconductor devices has been expected. In order to produce a device by using the semiconductor element having the above-mentioned features, even in a case where the semiconductor element operates at a temperature higher than 150 degrees Celsius, it is necessary to secure stable operation of the semiconductor device by suppressing formation of a crack on a bonding material and degradation of wirings.

On the other hand, as a method for sealing a semiconductor element with a resin in a semiconductor device, Patent Document 1 proposes a method in which a dam material is used to enclose the periphery of a semiconductor element so as to seal a part of its inside with a resin. Further Patent Document 2 proposes a method in which a dam is formed in the periphery of a semiconductor element for stopping the flow of a resin which covers the semiconductor element.

PRIOR ART REFERENCE

Patent Document

[Patent Document 1]
  Japanese Patent Application Laid-Open No. 2003-124401
[Patent Document 2]
  Japanese Patent Application Laid-Open No. 58-17646

DISCLOSURE OF THE INVENTION

Problems to be Solved by the Invention

However according to the methods which are disclosed in Patent Document 1 and Patent Document 2, a semiconductor element is a wide band gap semiconductor element such as SiC, etc. and a semiconductor device comprising the wide band gap semiconductor element operates at higher temperatures than before, and a temperature of a heat cycle test becomes higher corresponding to the above-mentioned. Under the above-mentioned conditions, formation of a crack on a sealing resin member occurs, or separation of a sealing resin member from a substrate occurs. As a result, reliability of a semiconductor device has been seriously diminished.

This invention is made so as to solve the above-mentioned problems, and an objective of this invention is to obtain a high-reliability semiconductor device in which formation of a crack in a sealing resin member and separation of a sealing resin member from a substrate is hard to occur, even when subjected to heat cycles in which semiconductor elements repeatedly operate at high temperatures.

Means for Solving the Problems

According to this invention, a semiconductor device is provided with a semiconductor-element substrate in which a front-surface electrode pattern is formed on a surface of an insulating substrate and a back-surface electrode is formed on another surface of the insulating substrate; a semiconductor element which is affixed, using a bonding material, to the surface of the front-surface electrode pattern opposite the insulating substrate; and a sealing resin member which covers the semiconductor element and the semiconductor-element substrate, wherein at a position of the front-surface electrode pattern where the position has electric potential equivalent to electric potential of the front-surface electrode pattern at a position where a semiconductor element is bonded, an insulating terminal table which is formed with a conductive relay terminal and an insulating member that insulates the relay terminal and the front-surface electrode pattern from each other is provided, and a wiring from the semiconductor element to the outside is led out via the relay terminal.

Advantage of the Invention

As a semiconductor device according to the invention has the above-mentioned configuration, when the semiconductor device operates at high temperatures, separation between a sealing resin and a front-surface electrode pattern or an insulating substrate is hard to occur, or formation of a crack on a sealing resin is hard to occur. Therefore, malfunction which is caused by operation at high temperatures is hard to occur. As a result, a semiconductor having high reliability can be obtained.

BRIEF DESCRIPTION OF THE DRAWINGS

FIG. 13 shows results of a power cycle test and a heat cycle test of a semiconductor device according to EXAMPLE 2 of this invention.

FIG. 14 shows results of a power cycle test and a heat cycle test of a semiconductor device according to EXAMPLE 3 of this invention.

FIG. 15 shows results of a power cycle test and a heat cycle test of a semiconductor device according to EXAMPLE 4 of this invention.

FIG. 16 shows results of a power cycle test and a heat cycle test of a semiconductor device according to EXAMPLE 5 of this invention.

BEST MODE FOR CARRYING OUT THE INVENTION

Embodiment 1

Figure 1:
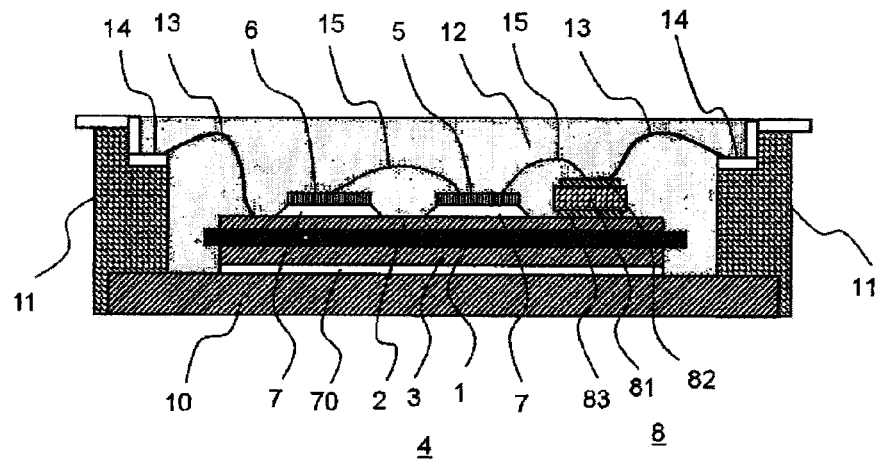
FIG. 1 is a cross-sectional view showing a basic configuration of a semiconductor device according to EMBODIMENT 1 of this invention.
Figure 2:
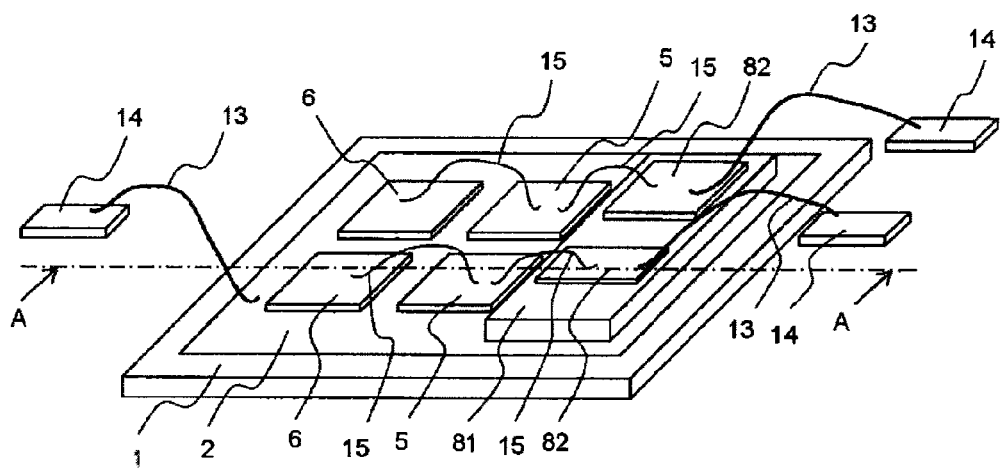
FIG. 2 is a perspective view showing a basic configuration of a semiconductor device according to EMBODIMENT 1 of this invention in which some components are removed.

FIG. 1 is a cross-sectional view showing a basic configuration of a semiconductor device according to EMBODIMENT 1 of this invention, FIG. 2 is a perspective view showing a basic configuration of a semiconductor device in which a case side plate and a base plate are omitted and a sealing resin member is removed. FIG. 1 is a cross-sectional view taken on line A-A of FIG. 2. A semiconductor device according to this invention is provided with a semiconductor-element substrate 4 wherein a front-surface electrode pattern 2 is formed on a top surface of an insulating substrate 1 and a back-surface electrode 3 is formed on a back-surface of the insulating substrate 1, and semiconductor elements 5 and 6 are affixed to the surface of the electrode pattern 2 using a bonding material 7 such as solder. Here, for example, the semiconductor element 5 is a semiconductor element for electric power such as MOSFET which controls large amount of electric current, and the semiconductor element 6 is, for example, a return current diode which is provided in parallel with the semiconductor element 5. A side of the back-surface electrode pattern 3 of the semiconductor-element substrate 4 is affixed to a base plate 10 using a bonding material 70 such as solder. The base plate 10 is a bottom plate, and the base plate 10 and a case side plate 11 form a case, and a first sealing resin 12 is injected into the case so as to perform molding of resin. Wires 13 are connected to each semiconductor element for electrically connecting to the outside, and the wires 15 are connected to terminals 14. The semiconductor device according to Embodiment 1 is electrically connected to the outside via the terminal 14.

Regarding connection from the semiconductor element 5 to the terminal 14, it is necessary to use a thin wire on a chip of the semiconductor element 5 due to restrictions on space; on the other hand, it is necessary to use a thick wire for connecting to the terminal 14 because it requires strength. Consequently, a terminal table which relays wires is required. In this invention, a terminal table which relays wires is provided on the front-surface electrode pattern 2. Here, the terminal table is an insulating terminal table 8 having the configuration such that a relay terminal 82 to which a wire is connected is insulated from the front-surface electrode pattern 2. The insulating terminal table 8 comprises at least a conductor which is the relay terminal 82 for relaying wires and an insulating member 81 which insulates the conductor from the front-surface electrode pattern 2. As long as the insulating terminal table 8 has the configuration in which the front-surface electrode pattern 2 on the semiconductor-element substrate 4 and the relay terminal 82 to which a wire is connected are insulated each other, shape of the insulating terminal table 82 is not particularly restricted. Further, the insulating terminal table 8 is provided at a position of the front-surface electrode pattern where the position has electric potential equivalent to that of the front-surface electrode pattern at a position where a semiconductor element is bonded.

Any conductor which has necessary electric property can be used for the relay terminal 82, for example, copper, aluminum or iron can be used. A material which is used for the insulating material member 81 is, for example, an epoxy resin, however, it is not limited thereto, and any resin which has desired heat resistance and adhesion is acceptable. In addition to an epoxy resin, for example, a silicone resin, an urethane resin, a polyimide resin, a polyamide resin, an acrylic resin, etc. is preferably used. Further, in order to adjust heat resistance and a coefficient of thermal expansion, a cured resin product in which a ceramic powder is dispersed may be used. Further, as ceramic powder which is used, $Al_2O_3$, $SiO_2$, AlN, BN, $Si_3N_4$, etc. is used, however, it is not limited thereto, diamond, SiC, B2O3, etc. may be used. Regarding a shape of a grain of powder, in many cases, powder having a spherical shape is used, however, it is not limited thereto, a grain having a crushed shape, a granular shape, a phosphorous scale shape, and an aggregate of powder, etc. may be used. Regarding the filling amount of powder, any amount of filling by which necessary flow-ability, insulating quality and adhesion can be obtained is acceptable.

The insulating terminal table 8 comprises the insulating member 81 which is formed with an insulating material, and on a surface of the insulating member 81, a copper foil is formed, and the copper foil is the relay terminal 82. Further, on a surface of the insulating member 81 facing a side of the front-surface electrode pattern 2, a copper foil for bonding 83 is formed so as to bond to the front-surface electrode pattern 2 by solder, etc. The insulating terminal table 8 may be bonded to the front-surface electrode pattern 2 not by solder but by insulating adhesive, etc. In this case, the copper foil for bonding 83 is not necessarily formed. The relay terminal 82 may be formed by forming an island-shaped pattern by etching on the insulating member 81. Each island-shaped pattern is each relay terminal so as to relay each wire.

When the semiconductor element according to this invention is applied to a semiconductor element which operates at temperatures higher than 150 degrees Celsius as a power semiconductor element, not only in EMBODIMENT 1 but also other EMBODIMENTs, large effect can be obtained. Especially, when the semiconductor element is applied to so-called a wide band gap semiconductor, that is, a semiconductor which is formed of a material whose band gap is larger than that of silicon (Si), such as a silicon carbide, a gallium nitride based material, or diamond, large effect can be obtained. Further, in FIG. 2, only two semiconductor elements are mounted on one molded semiconductor device, however, it is not limited thereto, depending on the intended application, necessary number of semiconductor elements can be mounted on the semiconductor device.

In general, copper is used for the front-surface electrode pattern 2, the back-surface electrode pattern 3, the base plate 10 and the terminal 14, however, it is not limited thereto, aluminum or iron may be used, or a material combining thereof may be used. Further, on a surface, in general, nickel plating is performed, however, it is not limited thereto, gold plating or tin plating may be performed, and any constitution which can supply necessary current and voltage to a semi-conductor element is acceptable. Further, a composite material such as copper/Invar/copper may be used, and an alloy such as SiCAl or CuMo may be used. Further, the terminal 14 and the front-surface electrode pattern 2 are embedded in the first sealing resin member 12, therefore, in order to improve the adhesion with the resin member, minute recesses and projections may be formed on a surface, and an adhesion auxiliary layer may be formed by using a silane coupling agent.

The semiconductor-element substrate 4 refers to a substrate comprising the insulating substrate 1 made of a ceramic such as $Al_2O_3$, $SiO_2$, AlN, BN, $Si_3N_4$, etc. wherein the front-surface electrode pattern 2 and the back-surface electrode 3 made of copper or aluminum are formed. *It is necessary for the semiconductor-element substrate 4 to have both of heat radiation and insulating quality. The configuration of the semiconductor-element substrate 4 is not limited to the above, the semiconductor-element substrate 4, comprising the insulating substrate 1 which is a resin cured product in which ceramic powder is dispersed or in which a ceramic plate is embedded wherein the front-surface electrode pattern 2 and the back-surface electrode 3 are formed, is acceptable. Further, as ceramic powder which is used for the insulating substrate 1, $Al_2O_3$, $SiO_2$, AlN, BN, $Si_3N_4$, etc. is used, however, it is not limited thereto, diamond, SiC, $B_2O_3$, etc. may be used. Further, resin powder such as a silicone resin, an acrylic resin, etc. may be used. Regarding a shape of a grain of powder, in many cases, powder having a spherical shape is used, however, it is not limited thereto, a grain having a crushed shape, a granular shape, a phosphorous scale shape, and an aggregate of powder, etc. may be used. Regarding the filling amount of powder, any amount of filling by which necessary heat radiation and insulating quality can be obtained is acceptable. In general, a resin which is used for the insulating substrate 1 is an epoxy resin, however, it is not limited thereto, a polyimide resin, a silicone resin, an acrylic resin, etc. may be used, that is, a material which has both of insulating quality and adhesion is acceptable.

Wire bodies (hereinafter, will be referred as wires) having a circular cross section made of aluminum or gold are used for the wires 13 and 15, however, it is not limited thereto. For example, a wire which is made by forming a copper plate into a belt-like shape (which will be also referred as a ribbon) may be used. Further, necessary number of wires can be connected depending on the current density of semiconductor element. The wire 13 may be formed by connecting a piece of a metal such as a copper or a tin with a molten metal, and any configuration of a wire which can supply necessary current and voltage to a semiconductor element is acceptable.

Wire shape and wire diameter of the wires 13 and 15 may be selected appropriately and freely depending on an amount of current, wire length and an area of an electrode pad. For example, in a case where an amount of current is large, or wire length is long, a wire having a large diameter such as a wire having a diameter of 400 μm or a ribbon bond, etc. can be used. Further, SiC semiconductor elements are intended to reduce their area due to restrictions on cost, and in many cases, an area of an electrode pad is small. In this case, a wire having a thin diameter, for example, a wire having a diameter of 150 μm can be used.

In conventional semiconductor devices, for example, as shown in FIG. 1 of Patent Document 1, a conductive pattern which corresponds to a front-surface electrode pattern according to this invention is formed by dividing into a die pad for affixing a semiconductor element and a second pad for relaying wires. The die pad and the second pad are insulated and a circuit substrate is exposed between the die pad and the second pad. The circuit substrate, the conductive pattern and the semiconductor element are sealed with a sealing resin member, however, because there is a large difference in coefficient of thermal expansion between the sealing resin member and the circuit substrate material, when a semiconductor device is operated repeatedly at high temperatures, formation of a crack or separation occurs between the sealing resin member and the circuit substrate in a portion where the circuit substrate is exposed. Since a high voltage is applied between the die pad and the second pad, insulation breakdown may be caused when formation of a crack or separation occurs in the portion. On the other hand, in a semiconductor device according to Embodiment 1 of this invention, at least a part of a front-surface electrode pattern 2 which is bonded to a semiconductor element and a part of the front-surface electrode pattern 2 which is affixed to an insulating terminal table have the same potential, further, an insulating substrate 1 is not exposed between an insulating terminal 8 and a semiconductor element 5. Consequently, in the above-mentioned portions, formation of a crack or separation of a sealing resin member 12 may not occur, and insulation breakdown is hard to occur. As a result, a semiconductor device having high reliability can be provided.

Embodiment 2

Figure 3A:
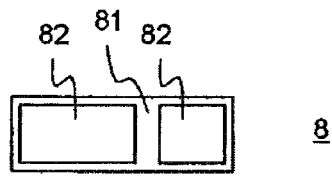
FIG. 3 (A), FIG. 3 (B) and FIG. 3 (C) are three orthographic views showing an insulating terminal table of a semiconductor device according to EMBODIMENT 2.
Figure 3B:
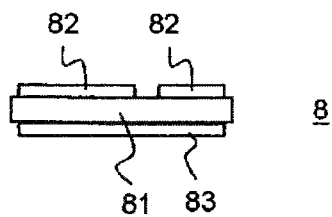
Figure 3C:
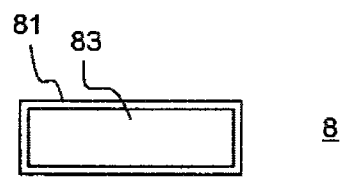

In EMBODIMENT 2, the configuration and a method for manufacturing an insulating terminal table 8 will be described. An example of the detailed configuration of the insulating terminal table 8 will be shown in FIG. 3. FIG. 3 (A) is a top view, FIG. 3 (B) is a side view and FIG. 3 (C) is a bottom view showing the insulating terminal table 8. On a top surface of an insulating member 81, a conductive material which is a relay terminal 82 is formed and on a back-surface of the insulating member 81, a copper foil for bonding 83 is formed. In FIG. 3, two relay terminals 82 are formed to be island shape and each relay terminal 82 is a relay terminal for each wire.

Here, an example of a method for manufacturing the insulating terminal table 8 shown in FIG. 3 will be described. A conductive material is stuck to both surfaces of an insulating member 81 composed of an insulating resin member so as to form a sheet-shaped member, a necessary pattern to be the relay terminal 82 is formed on the conductive material on the sheet-shaped member by using photoengraving process. After that, the pattern is cut into the desired size so as to form the insulating terminal table 8. The sheet-shaped member is prepared by using a semi-cured epoxy sheet as an insulating resin, for example, on both surfaces of the semi-cured epoxy sheet, a copper foil is stuck to by press forming so as to manufacture a both-sided copper clad sheet. A thickness of copper foil is not specifically limited as long as necessary electric property can be obtained. It is preferable to use copper foil having a thickness in a rage of 1 to 2000 μm, and it is more preferable to use a copper foil having a thickness in a range of 20 to 400 μm. In a case where a copper foil is too thin, during wire bonding for connecting wires, at a part where a copper foil and a wire are connected, the copper foil may be torn. In a case where a copper foil is too thick, it takes too much time to perform etching for pattern forming of a relay terminal, consequently, productivity is remarkably decreased. A thickness of the insulating member 81 is not specifically limited as long as necessary electric property can be obtained. It is preferable to adjust the thickness to be in a rage of 1 to 5000 μm, and it is more preferable to adjust the thickness to be in a range of 50 to 2000 μm. In a case where the thickness of a resin is too thin, necessary insulating property can not be obtained, and in a case where the thickness of a resin is too thick, handling of wires during wire bonding becomes difficult or cutting the pattern into the desired size becomes difficult. Further, general glass epoxy substrate can be used as a sheet-shaped member.

A pattern of the relay terminal 82 is formed by coating a photosensitive composition (photo-resist), performing pattern-exposing and developing so as to leave a necessary portion of a conductive material which is to be the relay terminal 82. Further, in a case where a pattern is not necessary for relay terminals, that is, in a case where only one relay terminal is formed, the above-mentioned step can be omitted.

Cutting out of an insulating terminal table can be performed by using general cutting technique such as laser cutting, router processing, etc. Size of an insulating terminal table can be appropriately selected depending on size of a semiconductor element substrate on which the insulating terminal table is mounted. Further, in a case where wires are connected by wire bonding, shape of the insulating terminal table is regulated by restrictions such as a wire diameter to be used, positioning accuracy of swing-down of a wire bonder, etc. For example, an insulating terminal table having 5 mm length, 25 mm width and 1 mm height (total thickness of a copper foil and a resin) is used.

In addition to the above-mentioned method for manufacturing an insulating terminal table, for example, an insulating terminal table can be manufactured by sticking a copper foil to one surface of an insulating resin and forming a desired pattern of a relay terminal by etching. In a case of the above-mentioned method for manufacturing an insulating terminal table, a method for affixing the insulating terminal table to a semiconductor-element substrate includes affixing the insulating terminal table to any desired position of a semiconductor-element substrate by using an insulating adhesive such as an epoxy resin, etc., heating the insulating terminal table higher than a softening temperature of an insulating resin and pushing the insulating terminal table to any desired position of a semiconductor-element substrate and then cooling so as to be affixed, etc.

Further, for example, as will be described in Embodiment 4, the configuration, in which a relay terminal is made of a block of conductive material, an insulating adhesive is used as an insulating member, and the block of conductive material is affixed to a front-surface electrode pattern, is acceptable. As a conductive material, copper, iron, aluminum, or a composite material thereof can be used. A shape of a block can be adjusted depending on a semiconductor device to be used. In a case where a relay terminal comprising a conductive material is used, in order to ensure insulation between a front-surface electrode pattern of a semiconductor-element substrate, an insulating adhesive such as an epoxy resin, etc. is used.

Further, it is preferable such that a linear expansion coefficient of an insulating member which insulates a relay terminal of an insulating terminal table from a front-surface electrode pattern is made close to that of a first sealing resin member. When a coefficient of linear thermal expansion of the insulating member and that of the first sealing resin member are greatly different, in a case of repeat of operation of semiconductor element, that is, when a heat cycle is caused, separation on an interface of the insulating member and the first sealing resin member may occur. Consequently, it is preferable such that the difference of linear expansion coefficient between the insulating member and the first sealing resin member is 15 ppm or lower.

Embodiment 3

Figure 4:
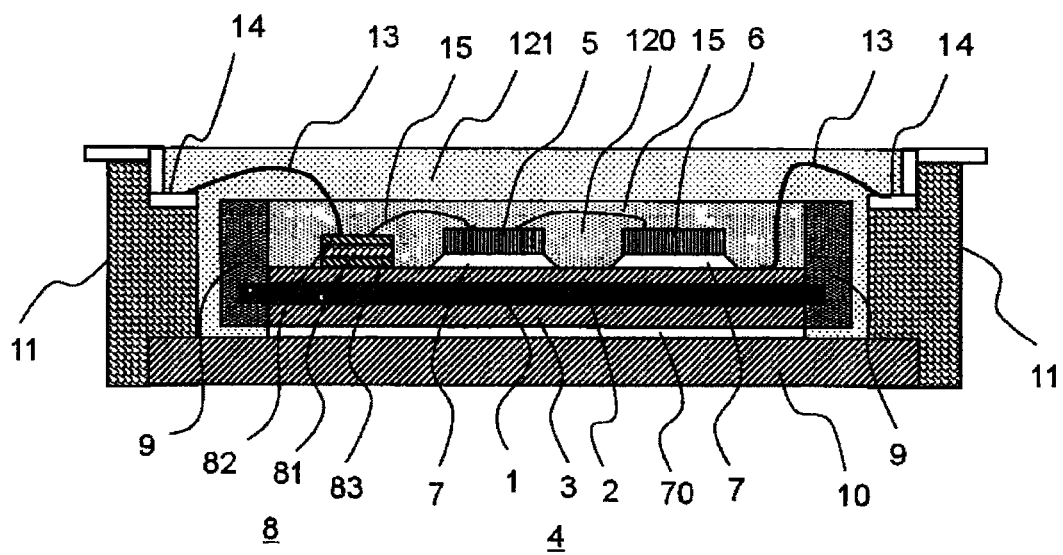
FIG. 4 is a cross-sectional view showing a basic configuration of a semiconductor device according to EMBODIMENT 3 of this invention.
Figure 5:
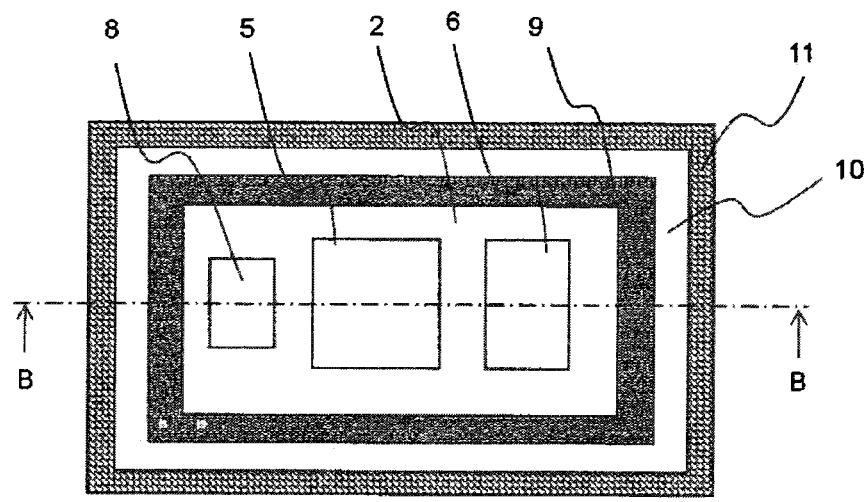
FIG. 5 is a top view showing a basic configuration of a semiconductor device according to EMBODIMENT 3 of this invention in which some components are removed.

FIG. 4 is a cross-sectional view showing a basic configuration of a semiconductor device according to EMBODIMENT 3 of this invention, and FIG. 5 is a top view showing a basic configuration of a semiconductor device according to EMBODIMENT 3 of this invention in which a sealing resin member, a wire and a terminal are removed. In FIG. 4 and FIG. 5, the same reference character as that in FIG. 2 indicates the same or a corresponding part. FIG. 4 is a cross-sectional view taken on line A-A of FIG. 5, and shows the configuration including a sealing resin member, a wire and a terminal. As shown in FIG. 4 and FIG. 5, in Embodiment 3, a partition wall 9 made of resin is formed so as to enclose the periphery of a semiconductor-element substrate 4. An inside region which is separated by the partition wall 9 is covered with a first sealing resin member 120. Further, the outside of the first sealing resin member 120 and the partition wall 9 is covered with a second sealing resin member 121.

As a material for the partition wall 9, for example, a silicone resin is used, however, it is not limited thereto, a urethane resin, an acrylic resin, etc. can be used. Further, a resin to which a ceramic powder such as $Al_2O_3$, $SiO_2$, etc. is added can be used, however, it is not limited thereto, AlN, BN, $Si_3N_4$, diamond, SiC, $B_2O_3$, etc. may be added, and resin powder such as a silicone resin, an acrylic resin, etc. may be added. Regarding the shape of a grain of powder, in many cases, a grain of powder having a spherical shape is used, however, it is not limited thereto, a grain of powder having a crushed shape, a granular shape, a phosphorous scale shape, and an aggregate of powder etc. may be used. Regarding the filling amount of powder, any amount of filling by which necessary flow-ability, insulating quality and adhesion can be obtained is acceptable. However, a modulus of elasticity of the partition wall 9 should be lower than that of the first sealing resin member 120.

When a semiconductor element operates at high temperatures, the first sealing resin member 120 which is formed in the periphery of the semiconductor element and the semiconductor-element substrate 4 are thermally expanded and when the semiconductor element stops operation, thermal contraction occurs. That is, a heat cycle is caused. The first sealing resin member 120 is adjusted to have the coefficient of linear thermal expansion which is close to that of a material of the front-surface electrode pattern 2 and the back-surface electrode 3 (for example, copper) among the materials constituting the semiconductor-element substrate 4, therefore, the coefficient of linear thermal expansion of the first sealing resin member 120 is different from that of the insulating substrate 1. In conventional semiconductor devices, a portion of the insulating substrate where the front-surface electrode pattern 2 and the back-surface electrode 3 are not formed, directly contacts a sealing resin. After a heat cycle is caused repeatedly, due to the difference of coefficient of linear thermal expansion between them, at a portion where the sealing resin and the insulating substrate are contacted, formation of a crack in the sealing resin and separation of the sealing resin from the substrate occurs. As a result, reliability of semiconductor devices has been remarkably decreased. However, according to a semiconductor device in EMBODIMENT 3 of this invention shown in FIG. 4 and FIG. 5, in the semiconductor-element substrate 4 as a single unit, before the substrate 4 is covered with the first sealing resin member 120, a partition wall 9 made of resin having a lower modulus of elasticity than that of the first sealing resin member 120 is formed at a portion where the insulating substrate 1 is exposed. Consequently, when a heat cycle is caused, at a part of the partition wall 9 which has a lower modulus of elasticity than that of the first sealing resin member 120, stress which is generated by the difference of coefficient of linear thermal expansion between them is relaxed, and formation of a crack in the first sealing resin member 120 and separation of the first sealing resin member 120 is hard to occur. As a result, a semiconductor device having high reliability can be obtained.

Figure 6:
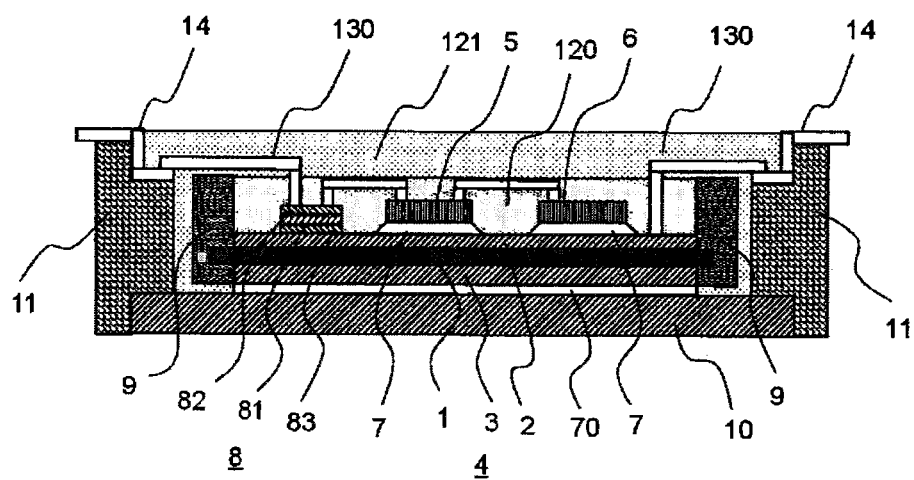
FIG. 6 is a cross-section view showing another basic configuration of a semiconductor device according to EMBODIMENT 3 of this invention.

Further, FIG. 6 shows an example in which a copper plate 130 is used as a wiring. In FIG. 6, the same reference character as that in FIG. 1 and FIG. 4 indicates the same or a corresponding part. For rust prevention of a surface of the copper plate 130, nickel plating may be performed, and also a chemical treatment using a rust-preventive agent may be performed. Further, in order to improve the adhesion with each resin, irregularity may be formed on the surface, and a chemical treatment using a silane coupling agent may be performed. Here, an example in which a copper plate is used as a wiring is shown; however, it is needless to say such that any material other than copper, which can electrically connect to a terminal 14, which can also electrically connect to a semiconductor element 5 and which can secure necessary current capacity, is acceptable.

As long as the height of the partition wall 9 is higher than that of semiconductor elements 5 and 6 so as for the first sealing resin member 120 to cover the semiconductor elements 5 and 6, and the height of the partition wall 9 does not exceed the height of a case side plate 11 of a semiconductor device, any height of the partition wall 9 is acceptable. Alternatively, a method for completely sealing a semiconductor element in which the surface tension of the first sealing resin 120 is utilized so as to make the state of the first sealing resin 120 being higher than the height of the partition wall 9 can be used. In many cases, the size of the insulating substrate 1 is 100 mm×100 mm or smaller, therefore, it is preferable such that the width of the partition wall 9 is 1 to 2 mm; however, it is not limited thereto, any width which is necessary to separate the first sealing resin member 120 from outer region is acceptable.

As the second sealing resin member 121, for example, a silicone resin is used, however, it is not limited thereto, a urethane resin, an acrylic resin, etc. can be used. Further, a ceramic powder such as $Al_2O_3$, $SiO_2$, etc. may be added to a resin, however, it is not limited thereto, AlN, BN, Si3N4, diamond, SiC, $B_2O_3$, etc. may be added, and resin powder such as a silicone resin or an acrylic resin may be added. Regarding a shape of a powder, in many cases, a powder having a spherical shape is used, however, it is not limited thereto, a powder having a crushed shape, a granular shape, a phosphorous scale shape, and an aggregate of a powder, etc. may be used. Regarding the filling amount of powder, any amount of filling by which necessary flow-ability, insulating quality and adhesion can be obtained is acceptable.

According to EMBODIMENT 3 of this invention, the partition wall 9 is formed in the periphery part of the semiconductor-element substrate 4 so as to cover the inside of the partition wall 9 with the first sealing resin member 120, and the second sealing resin member 121 is formed so as to cover the partition wall 9 and the first sealing resin member 120. The partition wall 9 and the second sealing resin member 121 are made by using a material whose modulus of elasticity is lower than that of the first sealing resin member 120. When the thermal stress is generated in a case where curing shrinkage is caused in the sealing resin member and when a heat cycle is caused, the stress is relaxed by the partition wall 9 having a low modulus of elasticity. Consequently, the stress loading which is applied to the semiconductor-element substrate 4 is reduced. Further, in comparison with a case in which an outside of the semiconductor-element substrate 4 is sealed with a resin having the same modulus of elasticity of that of the first sealing resin member 120, when an outside of the semiconductor-element substrate 4 is sealed with the second sealing resin member 121 having a lower modulus of elasticity, the stress loading which is generated on a base plate and a semiconductor-element substrate is reduced. As a result, separation of the first sealing resin member 120 from the semiconductor-element substrate 4 and formation of a crack on the first sealing resin member 120 can be prevented, and a semiconductor device having high reliability can be obtained.

Embodiment 4

Figure 7:
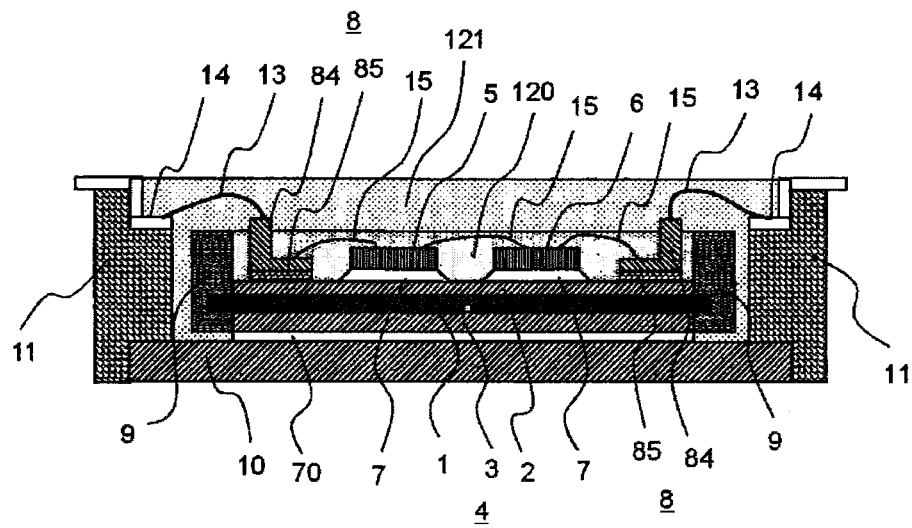
FIG. 7 is a cross-sectional view showing a basic configuration of a semiconductor device according to EMBODIMENT 4 of this invention.

FIG. 7 is a cross-sectional view showing the basic configuration of a semiconductor device according to EMBODIMENT 4 of this invention. In FIG. 7, the same reference character as that in FIG. 1, FIG. 4 and FIG. 6 indicates the same or a corresponding part. As shown in FIG. 7, according to EMBODIMENT 4, a copper block is used for a relay terminal 84 to form an insulating terminal table 8. According to the configuration, the relay terminal 84 made of copper block is exposed from a first sealing resin member 120, and the relay terminal 84 is affixed to a semiconductor-element substrate 4 by an insulating adhesive 85 such as an epoxy resin, etc. The insulating adhesive 85 is a constituent of an insulating member of the insulating terminal 8, and as long as the insulating adhesive 85 has desired electrical insulating property, heat resistance and adhesion, any insulating adhesive is acceptable.

According to the above-mentioned configuration, by connecting a wire from a part of the front-surface electrode pattern 2 which is the outside of the partition wall 9 to a terminal 14, etc. via the relay terminal 84 so as to make electrical connection from inside of the module to the outside of the module, the wire is not passed an interface between a first sealing resin member 120 and a second sealing resin member 121. Consequently, even when subjected to heat cycles repeatedly, a wire is hard to be broken. At this time, in order to improve the adhesion with the sealing resin member, irregularity may be formed on the relay terminal 84 and the front-surface electrode pattern 2, or a primer treatment using an adhesion improver, etc. may be performed. As the adhesion improver, for example, a silane coupling agent, a polyimide resin or an epoxy resin, etc. is used, however, any adhesion improver which improves the adhesion between a wire 15 to be used and the first sealing resin member 120 is acceptable.

Embodiment 5

Figure 8:
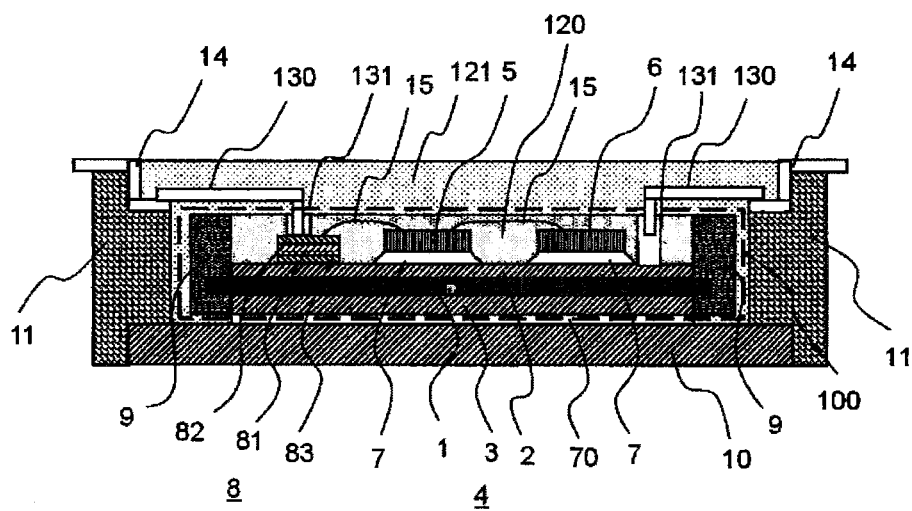
FIG. 8 is a cross-sectional view showing a basic configuration of a semiconductor device according to EMBODIMENT 5 of this invention.

FIG. 8 is a cross-sectional view showing a basic configuration of a semiconductor device according to EMBODIMENT 5 of this invention. In FIG. 8, the same reference character as that in FIG. 1, FIG. 4, FIG. 6 and FIG. 7 indicates the same or a corresponding part. In EMBODIMENT 5, a socket 131 is provided for connecting a wire to a part which is covered with a sealing resin 120 such as a relay terminal 82 and a front-surface electrode pattern 2. The socket 131 is provided so as to be exposed to a surface of the first sealing resin member 120. According to the above-mentioned configuration, a wire can be inserted to the socket 131 from outside, after the inside of a partition wall is covered with the first sealing resin member 120, In general, by inserting a metal pin into a metal pipe, a socket can make electrically connection between them; however, it is not limited thereto, any configuration, which can make electrically connection between the parts which are embedded in the first sealing resin member 120 and a wire, is acceptable. Further, on a surface of the socket 131, in order to improve the adhesion with the first sealing resin member 120 or with a second sealing resin member 121, irregularity may be formed, or a chemical treatment using a silane coupling agent may be performed. In general, the socket 131 and the relay terminal 82 or the front-surface electrode pattern 2 are electrically connected by using a solder material, however, it is not limited thereto, silver paste or a material which is metallically bonded by sintering is acceptable. In FIG. 8, wiring to the socket 131 is performed by using a copper plate 130; however, it is not needless to say such that a normal linear wire body may be used.

Figure 9:
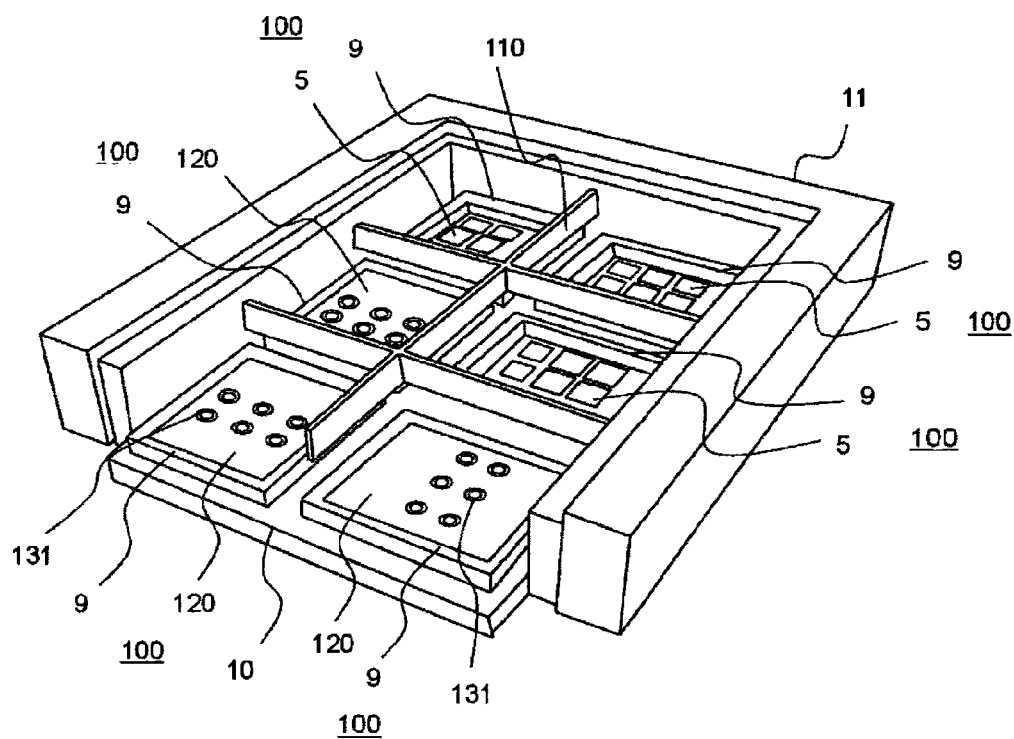
FIG. 9 is a perspective view showing a basic configuration of a semiconductor device which is produced by arranging a plurality of modules of a semiconductor device according to EMBODIMENT 5 of this invention, wherein a sealing resin member and some components are removed.
Figure 10A:
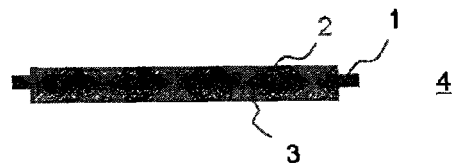
FIG. 10 is pattern diagram showing a method for manufacturing a semiconductor device according to EMBODIMENT 6 of this invention.
Figure 10B:
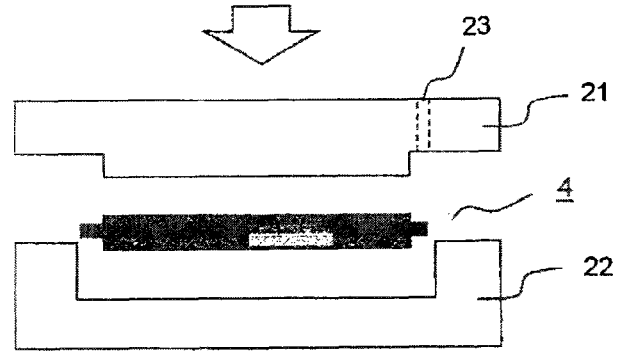
Figure 10C:
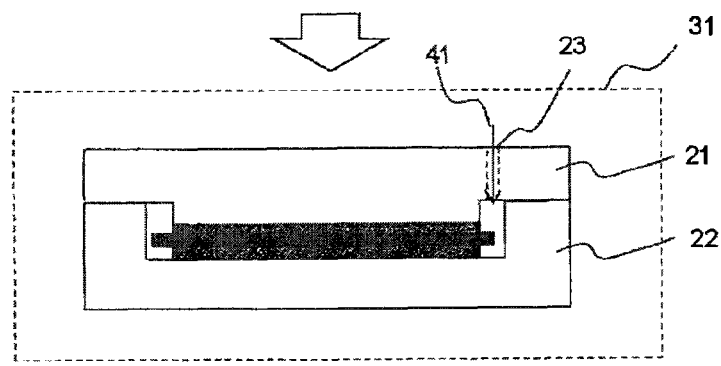
Figure 10D:
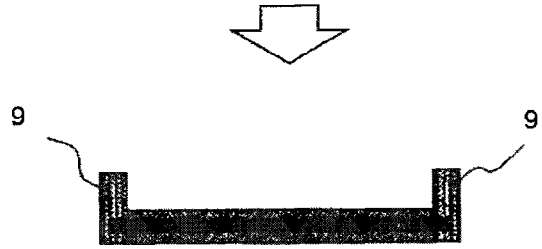

A part which is indicated by a broken line in FIG. 8, that is, a component wherein the semiconductor elements 5 and 6 are sealed with the first sealing resin member 120 which is injected to the inside of the partition 9 is referred as a module 100. FIG. 9 is a schematic view showing the basic configuration of a semiconductor device wherein a plurality of the modules 100 are arranged in a case side plate 11 so as to constitute one semiconductor device. In FIG. 9, the same reference character as that in FIG. 8 indicates the same or a corresponding part. In FIG. 9, a second sealing resin 121, terminals 14 and wires 130 are removed. Further, in a part of FIG. 9, the first sealing resin member 120 is also removed; therefore, semiconductor elements can be seen. That is, FIG. 9 is a perspective view. In FIG. 9, a bar 110 which is provided between each module is a member for fixing terminals (In FIG. 9, terminals are removed) for bridging wires from each module, According to the above-mentioned configuration, after the semiconductor elements 5 and 6 are sealed with the first sealing resin member 120, and before a module is sealed with the second sealing resin member 121, by supplying an electrical current from the socket 131, operation test of each module 100 can be performed. In operation test, in a case where a defective module is found, connecting of a semiconductor-element substrate 4 and a base plate 10 can be removed and the defective module can be replaced by non-defective module. As a result, the yield of a semiconductor device can be improved.

Embodiment 6

FIG. 10 is a pattern diagram showing a method for manufacturing a semiconductor device according to this invention in which a partition wall 9 is formed. The partition wall 9 is formed by injecting an uncured resin in a syringe and extruding the uncured resin at a necessary point so as to perform drawing, or by using a screen mask. However, according to the above-mentioned methods, it requires a long manufacturing time. According to a method wherein a front-surface electrode pattern and a back-surface electrode are sandwiched with a jig having a groove formed therein, and then an uncured resin is injected and cured; a substrate having a various kinds of partition wall can be formed by changing a position and a shape of a groove which is formed in a jig.

First, a semiconductor-element substrate comprising an insulating substrate 1 in which a front-surface electrode pattern 2 is formed on a surface and a back-surface electrode 3 is formed on another surface, is prepared (FIG. 10 (A)). Further, a jig comprising an upper jig 21 and a lower jig 22 which are made of Teflon (trademark) is prepared ((FIG. 10 (B)). A resin injection hole 23 for injecting a resin is formed in the upper jig 21. At a predetermined position of the lower jig 22, the semiconductor-element substrate 4 is placed, and the semiconductor-element substrate 4 is covered with the upper jig 21 so as not to be shifted. When a resin is injected afterward, in order to prevent a resin from leaking from the upper and lower jigs, the jigs are sufficiently tightened by using a method such as fixing with screws, hydraulic press, etc. The upper jig 21 and the lower jig 22 should be formed to have enough flatness for a resin not to be leaked to a surface of the front-surface electrode pattern 2 and that of the back-surface electrode 3. Then, pressure of inside of the jigs which include the semiconductor-element substrate 4 is reduced to be 10 torr by using a decompression chamber 31, etc. After that, as indicated by an arrow in FIG. 10 (C), an uncured resin 41 is injected from the resin injection hole 23 of the upper jig 21 with the pressing force of approximately 1 MPa. When the resin is injected to the entire part of the space part of the jigs, the pressure of inside of the jigs is returned to be 760 torr (atmospheric pressure), and the resin is thermally cured. For example, in a case where KE1833 which is a silicone resin manufactured by Shin-Etsu Chemical Co, Ltd is used, the resin is cured at 120 degrees Celsius for one hour. After the resin is thermally cured, the jigs are cooled to be a room temperature and the substrate is taken out by dividing the upper and lower jigs. According to the above-mentioned, a substrate in which a partition wall 9 is molded can be produced (FIG. 10 (D)).

In order for the resin to be injected to entire space part from the resin injection hole 23, a portion where the partition wall 90 is formed should be connected by a space inside the jigs. Here, a deaeration hole may be formed in the jigs. Further, it is not needless to say that in order to improve the releasability, a release agent may be coated with a wall surface of a jig, and in addition to Teflon (trademark), other material may be used for a jig.

As above-mentioned, according to a method for manufacturing a semiconductor device of EMBODIMENT 6 of this invention, as jigs are used, resin cured products having the same shape can be formed with high dimensional accuracy. Further, under reduced pressure, a rein is injected by applying pressure, air bubbles are hard to be entrained in the partition wall comprising a low-elasticity resin, adhesion between an insulating substrate, an electrode pattern or a back-surface electrode is improved, and even in a case where heat cycles are caused, separation is hard to occur. As a result, insulation properties are also improved. Further, as an electrode pattern and a back-surface electrode pattern are sandwiched by the jigs; influence of surface oxidization due to temperature rise at resin curing is reduced, the effect capable of improving reliability when a semiconductor element or a base material is bonded by a bonding material can be obtained.

Embodiment 7

In EMBODIMENT 7, a semiconductor device module for test is prepared by using various kinds of material for a partition wall and a sealing resin, then a power cycle test and a heat cycle test are performed for the semiconductor device module, and obtained results are shown as Examples.

Example 1

Figures 11, 12:
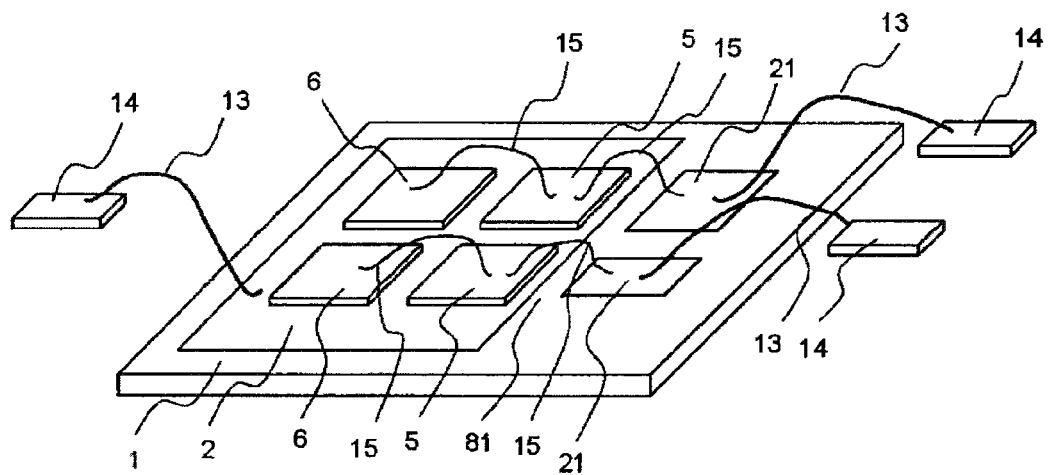
FIG. 11 shows results of a power cycle test of a semiconductor device according to EXAMPLE 1 of this invention.
FIG. 12 is a perspective view showing a basic configuration of a semiconductor device according to COMPARATIVE EXAMPLE in which some components are removed.

First, a semiconductor device having the configuration shown in FIG. 4 according to EMBODIMENT 3 was manufactured, and a semiconductor device having the configuration shown in FIG. 12 according to a comparative example was manufactured, and after and before performing a heat cycle test, PDIV (Partial Discharge Inception Voltage) was measured. The semiconductor device according to a comparative example has the configuration shown in FIG. 12 which is equivalent to that of conventional technologies. In the same way as shown in FIG. 2, FIG. 12 shows the configuration of a semiconductor device in which a case side plate, a base plate, etc. are omitted and a sealing resin member is removed. A semiconductor device according to a comparative example which is shown in FIG. 12 has the configuration in which a wire is relayed not by using an insulating terminal table but by a relay terminal pattern 21, which is electrically insulated from a front-surface electrode pattern and is formed on a surface of an insulating substrate 1 in the same was as that of the front-surface electrode pattern 2.

A heat cycle test is performed by placing the whole of semiconductor device in a thermostatic chamber whose temperature can be controlled, wherein the temperature is repeatedly changed in a range of −40 degrees Celsius to 150 degrees Celsius. PDIV was measured by using a partial discharge testing machine. By connecting an electrode between electrode patterns and increasing the voltage at 60 Hz AC frequency in an inert liquid at 25 degrees Celsius, a voltage is read when a partial discharge of 10 pC or higher is generated. The above-mentioned was performed with n=5, and the result was valued by its average value. Results are shown in FIG. 11. Both of a semiconductor device having the configuration shown in FIG. 4 of this invention and a semiconductor device according to a comparative example have excellent property in the initial state. However, after a heat cycle test was performed, in comparison with a semiconductor device according to a comparative example, a partial discharge voltage of the semiconductor device having the configuration shown in FIG. 4 is sufficiently excellent.

In EXAMPLES 2 to 5, semiconductor devices in which insulating terminal tables and semiconductor elements were mounted on a semiconductor-element substrate as shown in FIG. 4 or FIG. 7, and each package was connected by wire were manufactured and a power cycle test and a heat cycle test were performed. Results of the tests will be described. In a power cycle test, an electric current was supplied to a semiconductor element until 200 degrees Celsius, when a temperature of the semiconductor element reached 200 degrees Celsius, supplying of electric current was stopped so as to cool the semiconductor element to be 120 degrees Celsius, and after the semiconductor element was cooled, an electric current was supplied to the semiconductor element again. Further, a heat cycle test was performed by placing the whole of semiconductor device in a thermostatic chamber whose temperature can be controlled; the temperature was repeatedly changed in a range of −40 degrees Celsius to 150 degrees Celsius.

Example 2

In EXAMPLE 2, semiconductor devices having the configuration shown in FIG. 4 in which partition walls 9 having various moduli of elasticity were formed were manufactured and the power cycle tests and the heat cycle tests were performed on the semiconductor devices. FIG. 13 shows results of the power cycle tests and the heat cycle tests on the semiconductor devices in which EX-550 (modulus of elasticity: 7.0 GPa) manufactured by Sanyu Rec Co., Ltd. was used for a first sealing resin member 120 and SE1885 (modulus of elasticity: 15 kPa) manufactured by Dow Corning Toray Co., Ltd. was used for a second sealing resin member 121, and a modulus of elasticity of the partition wall 9 was varied.

For an insulating terminal table 8, EI-6782GH manufactured by SUMITOMO BAKELITE CO., LTD was used as an insulating member 81, a copper foil having a thickness of 105 micron was affixed to one surface of the insulating member 81, the insulating member 81 with the copper foil was processed to be a desired size, a pattern of a relay terminal 82 was formed by etching, and the insulating terminal table 8 was affixed to a semiconductor-element substrate by using EX-550 manufactured by Sanyu Rec Co., Ltd. For producing the semiconductor device, a base plate 10 having the size of 50×92×3 mm, an insulating substrate 1 made of AlN having the size of 23.2×23.4×1.12 mm, a semiconductor element made of SiC having the size of 5×5×0.35 mm, a bonding material made of M731 manufactured by SENJU METAL INDUCTRY CO., LTD., a case side plate which is made of polyphenylene sulfide (PPS) and a wire made of aluminum having a diameter of 0.4 mm were used. Further, in this test, only one SiC semiconductor element was mounted on inside of the module, and the power cycle test and the heat cycle test were performed.

Example 2-1 in FIG. 13 will be described. In a case where the partition wall 9 was prepared by using SE1885 (modulus of elasticity: 15 kPa) manufactured by Dow Corning Toray Co., Ltd, it was found out such that in performing the power cycle test, after 110000 cycles, separation of the first sealing resin member 120 occurred, and in performing the heat cycle test, after 200 cycles, separation of the first sealing resin member 120 and formation of a crack on the first sealing resin member 120 occurred, and as a result, the semiconductor device stopped operating.

In example 2-2, as a result of preparing the partition wall 9 by using SE1886 (modulus of elasticity: 30 kPa) manufactured by Dow Corning Toray Co., Ltd., it was found out such that in the power cycle test, the result was improved up to be 200000 cycles, and in the heat cycle test, the result was improved up to be 800 cycles.

In example 2-3, as a result of preparing the partition wall 9 by using KE1833 (modulus of elasticity: 3.5 MPa) manufactured by Shin-Etsu Chemical Co., Ltd., it was found out such that in the power cycle test, the result was improved up to be 210000 cycles, and in the heat cycle test, the property of the semiconductor device was maintained to be 1200 cycles or more.

In example 2-4, as a result of preparing a partition wall 9 by adding approximately 50 wt % of glass filler to KER-4000 manufactured by Shin-Etsu Chemical Co., Ltd. so as to adjust a modulus of elasticity to be 900 MPa, it was found out such that in a power cycle test, the property of a semiconductor device can be maintained to be 200000 cycles and in a heat cycle test, the property of a semiconductor device can be maintained to be 1200 cycles or more.

In example 2-5, as a result of preparing a partition wall 9 by using SCR-1016 (modulus of elasticity; 1400 MPa) manufactured by Shin-Etsu Chemical Co., Ltd., it was found out such that in the power cycle test, the result was reduced to be 180000 cycles, and in the heat cycle test, the result was also reduced to be 500 cycles.

In example 2-6, when approximately 54 wt % of glass filler was added to SCR-1016 manufactured by Shin-Etsu Chemical Co., Ltd. so as to adjust a modulus of elasticity to be 3000 MPa, and the partition wall 9 was prepared by using the above-mentioned material, it was found out such that the result was reduced to be 120000 cycles in the power cycle test and the result was also reduced to be 250 cycles in the heat cycle test.

According to the above-mentioned results, it was found out such that it is proper for the partition wall 9 to have the range of a modulus of elasticity N which is 30 kPa or higher and less than 3 GPa.

Example 3

In EXAMPLE 3, semiconductor devices having the configuration shown in FIG. 4 in which first sealing resin members 120 having various moduli of elasticity were formed were manufactured and the power cycle tests and the heat cycle tests were performed on the semiconductor devices. FIG. 14 shows results of the power cycle tests and the heat cycle tests on the semiconductor devices in which KE1833 (modulus of elasticity: 3.5 MPa) manufactured by Shin-Etsu Chemical Co., Ltd. was used for a partition wall 9 and SE1885 (modulus of elasticity: 15 kPa) manufactured by Dow Corning Toray Co., Ltd. was used for a second sealing resin member, and a modulus of elasticity of the first sealing resin member was varied. Here, an insulating terminal table was prepared by affixing a copper foil having a thickness of 105 micron to one surface of EI-6782GH manufactured by SUMITOMO BAKELITE CO., LTD and processing to a desired size, and forming a relay terminal pattern by etching. The insulating terminal table was affixed to a semiconductor-element substrate by using EX-550 manufactured by Sanyu Rec Co., Ltd.

Example 3-1 in FIG. 14 will be described. As a first sealing resin member, a resin which was prepared by adding approximately 50 wt % of glass filler to KER-4000 manufactured by Shin-Etsu Chemical Co., Ltd. so as to adjust a modulus of elasticity to be 0.9 GPa was used. It was found out such that in the power test, separation of the sealing resin member occurred after 100000 cycles, and in the heat cycle test, separation of the sealing resin member and formation of a crack on the sealing resin member occurred after 100 cycles, as a result, the semiconductor device stopped operating.

In example 3-2, as a first sealing resin member, a resin which was prepared by adding approximately 58 wt % of glass filler to KER-4000 manufactured by Shin-Etsu Chemical Co., Ltd. so as to adjust a modulus of elasticity to be 1 GPa, was used. It was found out such that the result was improved up to be 170000 cycles in the power cycle test and the result was improved up to be 350 cycles in the heat cycle test.

In example 3-3 EX-550 (modulus of elasticity: 7.0 GPa) manufactured by Sanyu Rec Co., Ltd. was used for a first sealing resin member. It was found out such that the result was improved up to be 210000 cycles in the power cycle test and the result was improved to be 1200 cycles or more in the heat cycle test.

In example 3-4, a sealing resin member which was prepared by adding approximately 15 wt % of silica filler to EX-550 manufactured by Sanyu Rec Co., so as to adjust a modulus of elasticity to be 12 GPa was used. It was found out such that the result was 170000 cycles in the power cycle test and the result was 700 cycles in the heat cycle test.

In example 3-5, a sealing resin member which was prepared by adding approximately 20 wt % of silica filler to EX-550 manufactured by Sanyu Rec Co., so as to adjust a modulus of elasticity to be 14 GPa was used. It was found out such that the result was 140000 cycles in the power cycle test and the result was 500 cycles in the heat cycle test.

In example 3-6, a sealing resin member which was prepared by adding approximately 36 wt % of silica filler to EX-550 manufactured by Sanyu Rec Co., so as to adjust a modulus of elasticity to be 20 GPa was used. It was found out such that the result was 110000 cycles in the power cycle test and the result was 450 cycles in the heat cycle test.

In example 3-7, a sealing resin member which was prepared by adding approximately 40 wt % of silica filler to EX-550 manufactured by Sanyu Rec Co., so as to adjust a modulus of elasticity to be 22 GPa was used. It was found out such that the result was 100000 cycles in the power cycle test and the result was 200 cycles in the heat cycle test.

According to the above-mentioned results, it was found out such that it is proper for the first sealing resin member to have the range of a modulus of elasticity which is 1 GPa or higher and 20 GPa or lower.

Example 4

In EXAMPLE 4, a semiconductor device having the configuration shown in FIG. 7, that is, in which a partition wall 9 was formed, as a relay terminal of an insulating terminal table 8, a copper block was processed to be a predetermined size and was affixed to a semiconductor-element substrate by using EX-550 manufactured by Sanyu Rec Co., Ltd. was manufactured, and a power cycle test and a heat cycle test were performed on the semiconductor device. FIG. 15 shows results of the power cycle tests and the heat cycle tests on the semiconductor devices in which KE1833 (modulus of elasticity: 3.5 MPa) manufactured by Shin-Etsu Chemical Co., Ltd. was used for a partition wall 9 and SE1885 (modulus of elasticity: 15 kPa) manufactured by Dow Corning Toray Co. Ltd. was used for a second sealing resin member 121, and a modulus of elasticity of the first sealing resin member 120 was varied.

The first sealing resin members of examples 4-1 to 4-7 were same as those of examples 3-1 to 3-7 in Example 3, respectively. As can be seen from the test results shown in examples 4-1 to 4-7 in Table 3, according to the above-mentioned configuration, slight difference regarding the number of cycles at high elastic modulus is observed in comparison with those in EXAMPLE 3, however, regarding the range of a modulus of elasticity of the first sealing resin member, the same results as those in EXAMPLE 3 were obtained. That is, also in EXAMPLE 4, it was found out such that it is proper for the first sealing resin member M to have the range of a modulus of elasticity which is 1 GPa or higher and 20 GPa or lower.

Example 5

FIG. 16 shows results of a power cycle test and a heat cycle test which were performed on a test module of a semiconductor device having the configuration in FIG. 5. For manufacturing the above-mentioned semiconductor device, a base plate having the size of 85×120×3 mm, an insulating substrate made of $Si_3N_4$ having the size of 23.2×23.4×1.12 mm, a semiconductor element made of SiC having the size of 5×5×0.35 mm, a bonding material made of M731 manufactured by SENJU METAL INDUCTRY CO., LTD., a case side plate which is made of polyphenylene sulfide (PPS) and a wire made of aluminum having a diameter of 0.4 mm were used. In EXAMPLE 5, the test was performed on a test module in which a material of an insulating substrate is different from that in EXAMPLE 3, and the size of a base plate is larger than that in Example 3, and a modulus of elasticity of the first sealing resin member 120 was varied. In performing the test, KE1833 (modulus of elasticity: 3.5 MPa) manufactured by Shin-Etsu Chemical Co., Ltd., was used for the partition wall 9, and SE1886 manufactured by Dow Corning Toray Co., Ltd. was used for a second sealing resin member 121. The first sealing resin members in examples 5-1 to 5-7 were same as those of examples 3-1 to 3-7 in EXAMPLE 3, respectively. As can be seen by comparing the test results shown in FIG. 15 and the test results shown in FIG. 13, in EXAMPLE 5, the same results as those in EXAMPLE 3 were obtained.

According to the above-mentioned test results in EXAMPLEs 2 to 5, it was found out such that by using a resin member having a modulus of elasticity having a range which is 1 Gpa or higher and 20 GPa or lower for the first sealing resin member, by using a resin having a modulus of elasticity having a range which is 30 kPa or higher and 3 GPa or less for the partition wall, a semiconductor device having high reliability in which separation and formation of a crack is hard to occur can be obtained.

REMARKS

1: insulating substrate
2: front-surface electrode pattern
3: back-surface electrode pattern
4: semiconductor-element substrate
5, 6: semiconductor element
7, 70: bonding material
8: insulating terminal table
9: partition wall
10: base plate
11: case side plate
12, 120: first sealing resin member
13, 15: wire
14: terminal
121: second sealing resin member
81, 85: insulating member
82, 84: relay terminal

The invention claimed is:

1. A semiconductor device, comprising:
   a semiconductor-element substrate in which a front-surface electrode pattern is formed on a surface of an insulating substrate and a back-surface electrode is formed on another surface of the insulating substrate;
   a semiconductor element affixed, via a bonding material, to the front-surface electrode pattern;
   a partition wall made of resin and formed to enclose the periphery of the insulating substrate;
   a first sealing resin member which covers the semiconductor element and the semiconductor-element substrate;
   an insulating terminal table affixed, via a bonding material, to the front-surface electrode pattern at a position having a same electric potential as a position on the front-surface electrode pattern where the semiconductor element is affixed, the insulating terminal table including a conductive relay terminal and an insulating member that insulates the conductive relay terminal and the front-surface electrode pattern from each other, and wiring from the semiconductor element to the outside is led out via the conductive relay terminal;
   a first wiring providing an electrical connection between the semiconductor element and the conductive relay terminal;
   a second wiring providing an electrical connection between the conductive relay terminal and a package terminal mounted on a package to which the semiconductor-element substrate is bonded; and
   a second sealing resin member is arranged between the partition wall and the package, and the second resin surrounds a top surface, side surface and bottom surface of the partition wall.

2. A semiconductor device according to claim 1, wherein the difference between the coefficient of linear thermal expansion of the insulating member and the coefficient of linear thermal expansion of the first sealing resin member is 15 ppm or lower.

3. A semiconductor device according to claim 1, wherein:
   a top surface of the partition wall is higher than a top surface of the semiconductor element,
   the partition wall is formed so as to enclose the periphery of the semiconductor-element substrate at a side of the semiconductor-element substrate where the semiconductor element is affixed; and
   the first sealing resin member fills the inside of the partition wall, and a modulus of elasticity of the partition wall is lower than the modulus of elasticity of the first sealing resin member.

4. A semiconductor device according to claim 3, wherein the second sealing resin member covers the first sealing resin member and the partition wall, and the second sealing resin member has a modulus of elasticity is lower than the modulus of elasticity of the first sealing resin member.

5. A semiconductor device according to claim 3, wherein the modulus of elasticity of the partition wall is in a range of 30 kPa to 3 GPa, and the modulus of elasticity of the first sealing resin member is in a range of 1 GPa to 20 GPa.

6. A semiconductor device according to claim 1, wherein the semiconductor element is formed of a wide band gap semiconductor.

7. A semiconductor device according to claim 6, wherein the wide band gap semiconductor is a semiconductor selecting from a silicon carbide, a gallium nitride based material and diamond.

8. A semiconductor device according to claim 4, wherein the modulus of elasticity of the partition wall is in a range of 30 kPa to 3 GPa, and the modulus of elasticity of the first sealing resin member is in a range of 1 GPa to 20 GPa.

9. A semiconductor device according to claim 1, wherein: the insulating member of the insulating terminal table is affixed directly to the front-surface electrode pattern.

10. A semiconductor device according to claim 1, wherein: the partition wall is in direct contact with the insulating substrate, and
    the second sealing resin member is further arranged between the partition wall and a base plate of the package to surround a bonding material that affixes the back-surface electrode pattern to the base plate of the package.

11. A semiconductor device according to claim 1, wherein the insulating member that insulates the conductive relay terminal and the front-surface electrode pattern from each other includes an insulating resin member.

* * * * *